United States Patent [19]

Suzuki et al.

[11] Patent Number: 5,831,910
[45] Date of Patent: Nov. 3, 1998

[54] SEMICONDUCTOR INTEGRATED CIRCUIT UTILIZING OVERDRIVEN DIFFERENTIAL AMPLIFIERS

[75] Inventors: Yukihide Suzuki, Akishima; Noriaki Kubota, Higashiyamato; Kouji Arai, Akishima; Tsugio Takahashi, Hamura; Shunichi Sukegawa, Tsukuba; Koichi Abe, Tokyo, all of Japan

[73] Assignees: Hitachi, Ltd., Tokyo, Japan; Texas Instruments Incorporated, Dallas, Tex.

[21] Appl. No.: 689,989

[22] Filed: Aug. 16, 1996

Related U.S. Application Data

[63] Continuation-in-part of Ser. No. 689,921, Aug. 16, 1996.

[30] Foreign Application Priority Data

Aug. 18, 1995 [JP] Japan ................................. 7-233391

[51] Int. Cl.$^6$ ...................................................... G11C 7/00
[52] U.S. Cl. ......................................... 365/189.11; 365/207
[58] Field of Search .......................... 327/52; 365/189.05, 365/205, 207, 208, 189.11

[56] References Cited

U.S. PATENT DOCUMENTS

| 4,980,799 | 12/1990 | Tobita ..................................... 365/182 |
| 5,097,446 | 3/1992 | Shoji et al. ........................... 365/185.11 |
| 5,402,042 | 3/1995 | Madsen .................................. 315/174 |
| 5,457,421 | 10/1995 | Tanabe .................................. 327/530 |
| 5,546,026 | 8/1996 | Lin et al. ................................. 327/52 |
| 5,668,770 | 9/1997 | Itoh et al. ............................... 365/156 |

FOREIGN PATENT DOCUMENTS

| A-4-281291 | 10/1992 | Japan . |
| A-5-62467 | 3/1993 | Japan . |
| A-5-135579 | 6/1993 | Japan . |

OTHER PUBLICATIONS

Nakamura et al., FA14.2: A 29ns 64Mb DRAM with Hierarchical Array.
Architecture, 1995 IEEE Int'l Solid–State Circuits Conference.

*Primary Examiner*—David C. Nelms
*Assistant Examiner*—Michael T. Tran
*Attorney, Agent, or Firm*—Antonelli, Terry, Stout & Kraus, LLP

[57] ABSTRACT

A semiconductor integrated circuit is provided in which a differential amplifier circuit such as a sense amplifier is operated at high speed even if the operating voltage is reduced. To achieve this, a MOS transistor for supplying the operating voltage to a drive line on the high-potential side of a differential amplifier circuit is of N-channel type and the amplitude of a switching control signal for controlling this transistor is the potential of the step-up voltage produced by stepping up a supply voltage in level. The output voltage of an internal step-up circuit for achieving a word-line selection level is utilizable as the step-up voltage.

18 Claims, 5 Drawing Sheets

SEMICONDUCTOR INTEGRATED CIRCUIT UTILIZING OVERDRIVEN DIFFERENTIAL AMPLIFIERS

CROSS REFERENCE TO RELATED APPLICATION

The present application is a continuation-in-part of an application Ser. No. 08/689,921 filed on even date herewith Aug. 16, 1996 by inventors Yukihide Suzuki, Tsugio Takahashi, Shunichi Sukegawa and Koichi Abe, entitled "Semiconductor Integrated Circuits", which applicants hereby incorporate by reference.

BACKGROUND OF THE INVENTION

The present invention relates to a semiconductor integrated circuit incorporating overdriven differential amplifiers, and, more particularly, to a DRAM using such overdriven differential amplifiers so that the operating voltage can be held at a low level due to the high degree of integration.

Recently, MOS transistors such as memory cell transistors have been miniaturized to increase the storage capacity of memory devices. In this miniaturization process, the gate oxide films of the transistors are made thinner than normal as the gate length of the MOS transistor is shortened. Accordingly, the operating voltage has been increasingly lowered.

In DRAMs in particular, it is effective to increase the word-line selection level or lower the voltage (i.e., the level reached by the data line through the amplifying operation of a sense amplifier) of the data line connected to the data input-output terminals of a memory cell when a high-level writing is carried out (i.e., the charging operation relative to the storage capacity of the memory cell) in such a way as to increase the operating efficiency of high-level reading (or so as to relatively increase the operating margin of high-level reading). When the gate oxide films of the MOS transistors of such memory devices are reduced in thickness with the higher integration of the transistors, however, it is not good to raise the voltage level of the word lines immoderately as stated above because the gate oxide films are liable to breakdown. Under such circumstances, lowering of the voltage of the data lines is inevitable. However, when the voltages of the data lines are thus lowered, it interferes with the high-speed operation of the sense amplifier. In other words, the current flowing through the sense amplifier tends to decrease when the operating voltage of the sense amplifier is lowered. Consequently, when the charged information in the memory cell is read to the data line, the rate of amplifying the minute potential difference between the data lines in complementary relation is lowered.

Therefore, sense amplifier overdriving techniques have been developed for operating the sense amplifiers at low voltage and high speed. When a sense amplifier is constituted with a CMOS static latch, an external supply voltage VDD is typically applied to the source of a P-channel MOS transistor via a drive line common to a plurality of sense amplifiers at the beginning of the sense amplifier activation timing period, and then a lower voltage VDL generated by stepping down the external supply voltage VDD is applied thereto so as to operate the sense amplifiers in a later portion of the sense-amplifier activation timing period. One such sense-amplifier overdriving technique is reported in ISSCC95, entitled "A 29 ns 64 Mb DRAM with Hierarchical Array Architecture".

SUMMARY OF THE INVENTION

From their studies of prior systems, the inventors have noted that in a sense amplifier having a CMOS static latch form, a power switch MOS transistor for supplying a driving voltage to the drive line of the P-channel MOS transistors of the sense amplifiers is also of P-channel type. Consequently, the gate-to-source voltage (VGS) of the power switch MOS transistor is lowered when the operating voltage is supplied thereto in a situation that the operating voltage of the sense amplifier is rendered lower. It has been found that, as a result, the capability of supplying current by means of the power switch MOS transistor is lowered and the high-speed operation of the sense amplifier is disturbed. Particularly, when the sense amplifier is operated with an overdriven arrangement, the high-speed operation of the sense amplifier is terribly hampered during the period when the step-down voltage is supplied. This problem is considered to become generally manifest not only when the sense amplifier is actually being overdriven, but also when the operating voltage of the differential amplifier circuit is rendered lower.

Accordingly, an object of the present invention is to provide a technique to prevent lowering of the capability of supplying an operating current by means of MOS transistors when the lowered operating voltage is supplied to an overdriven differential amplifier circuit.

Another object of the present invention is to provide a semiconductor integrated circuit in which a differential amplifier circuit such as a sense amplifier can be operated at high speed even if the operating voltage is rendered lower.

To achieve these and other objects, a transistor for supplying an operating voltage to a drive line on the high-potential side of a differential amplifier is of N-channel type and the amplitude of a switching control signal is set to be the potential of a step-up voltage generated by stepping up the supply voltage. The output voltage of an internal step-up circuit for forming a word-line selection level is utilizable as the step-up voltage.

In another embodiment, a MOS transistor for supplying an operating voltage to a drive line on the high-potential side of a differential amplifier is of P-channel type instead, and the amplitude of a switching control signal is the potential difference between a negative voltage whose polarity is opposite to that of the supply voltage. The output voltage of a substrate bias voltage generating circuit may be utilized as the negative voltage.

These MOS transistors for supplying the operating voltage to the drive line of the sense amplifier also supply at least a step-down voltage to the drive line after the differential amplifier circuit has initially been overdriven with a high level voltage. Further, a similar control arrangement may be adopted to another MOS transistor for supplying the high level supply voltage at the time of overdriving. When overdriving is not employed, this control arrangement may be applied to the MOS transistor for supplying the operating voltage to the drive line.

Even though the operating voltage of the differential amplifier circuit such as a sense amplifier is further lowered, the gate-to-source voltage for turning on the MOS transistor may be determined in accordance with factors such as the withstanding voltage of the gate oxide film of the N-channel MOS transistor since the MOS transistor for supplying the operating voltage to the drive line on the high potential side is of N-channel type. The reason for this is that as the operating voltage of the differential amplifier circuit is lowered, the gate-to-source voltage has no tendency to lower. Since the carrier mobility of the N-channel MOS transistor is three times greater than that of the P-channel MOS transistor, further, relatively high current supply capability is achieved even though the gate-to-source voltage is equal to or lower than that in the case of a P-channel MOS transistor. Consequently, the gate-to-source voltage of the N-channel transistor for supplying the operating voltage to the drive line on the high potential side is prevented from being lowered as the operating voltage becomes lowered, so that the differential amplifier circuit can be operated at high speed even in the state that the operating voltage is lowered.

Even when the MOS transistor for supplying the operating voltage to the drive line on the high-potential side of the differential amplifier circuit such as a sense amplifier is of P-channel type, the gate-to-source voltage of the MOS transistor can relatively be increased by setting the amplitude of the switching control signal within the range of the negative voltage to the supply voltage. Thus, the differential amplifier circuit can be operated at high speed even in a situation where the operating voltage is rendered lower.

The output of the step-up circuit for achieving the word-line selection level is utilized as the step-up voltage for regulating the amplitude of the signal for controlling the switching of the N-channel MOS transistor for supplying the operating voltage to the drive line on the high potential side. Moreover, the negative voltage generated by the substrate bias voltage generating circuit is also utilized as the negative voltage for regulating the amplitude of the signal for controlling the switching of the P-channel MOS transistor for supplying the operating voltage to the drive line. Thus, the circuit scale is prevented from being increased when the operating speed of the differential amplifier circuit is increased.

BRIEF DESCRIPTION OF THE DRAWINGS

The objects described above and other objects and novel features of the present invention will become apparent from the description taken in conjunction with the accompanying drawings, wherein.

DETAILED DESCRIPTION

Figure 5:
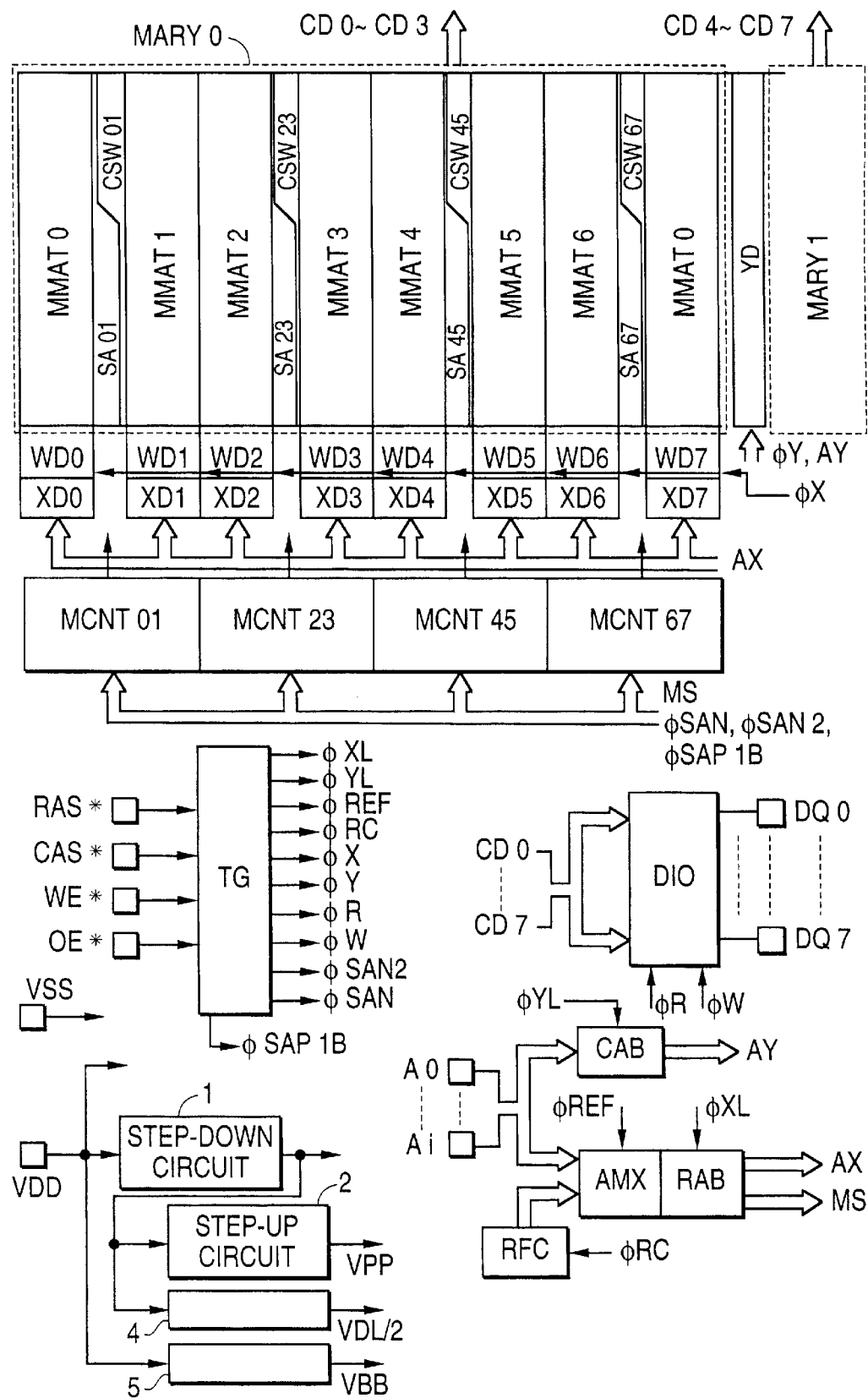
FIG. 5 is an overall block diagram of a DRAM embodying the present invention.

FIG. 5 is a block diagram of a DRAM embodying the present invention. The DRAM shown in FIG. 5 is preferably formed on one semiconductor substrate such as of single crystal silicon by means of a known semiconductor integrated circuit manufacturing technology, although the invention is not limited to such a single substrate arrangement. FIG. 5 shows two representative memory arrays MARY0, MARY1.

The DRAM of this embodiment receives an external supply voltage VDD of 3.3 V and a ground voltage of 0 V from external power supply terminal. The DRAM of this embodiment of the invention is such that MOS transistors in the respective memory arrays MARY0, MARY1 are made compact to increase the storage capacity, so that gate oxide films are rendered thinner as the gate length of the MOS transistor is shortened. For this reason, the operating voltage of tho memory arrays MARY0, MARY1 is lowered; for example, a step-down voltage VDL as low as 2.2 V is utilized as the basic operating power supply voltage. The step-down voltage VDL is produced by a step-down circuit 1 for stepping down an external supply voltage VDD. In FIG. 5, reference numeral 5 denotes a circuit for generating a substrate bias voltage VBB. Any known circuit may be used as the circuit 5 for generating the substrate bias voltage; for example, it can be made up of capacitors and diode elements for producing a negative-polarity, substrate bias voltage VBB on receiving a positive-polarity periodic signal, though the illustration of the circuit is omitted.

Each of the memory arrays MARY0, MARY1 is divided into eight memory mats MMAT0–MMAT7. Each of the memory mats MMAT0–MMAT7 includes many one-transistor type dynamic cells with selection terminals each connected to word lines and with data input-output terminals each connected to complementary data lines. The memory mats are each provided with word drivers WD0–WD7 and row address decoders XD0–XD7. Each of the row address decoders XD0–XD7 decodes an internal complementary row address signal AX and generates a word line selection signal when its operation is selected and further selects one word line corresponding to the internal complementary row address signal AX. The word drivers WD0–WD7 receive the word selection signal, select a word line to be selected according to the word line selection signal to drive the word line to a selection level in synchronization with the word-line driving timing designated by a control signal ØX. The word-line selection level determined by the word drivers WD0–WD7, is a step-up voltage VPP whose level is higher than that of the step-down voltage VDL. The step-up voltage VPP is generated by a step-up circuit 2 for stepping up the step-down voltage VDL. Although the details of the step-up circuit 2 are not shown, it may be formed readily by using a known charge pump circuit.

SA01, SA23, SA45, SA67 represent sense amplifier blocks and CSW01, CSW23, CS245, CSW67 represent column switch circuit blocks, each of them being placed between a pair of bilateral memory mats and used commonly by them. A shared data line structure is adopted for the pairs of bilateral memory mats with the sense amplifier blocks SA01, SA23, SA45, SA67 and the column switch circuit blocks CSW01, CSW23, CSW45, CSW67 held therebetween, so that the interposed sense amplifier blocks and column switch blocks can be used with either of the adjacent memory mats selected. The control of operation of the sense amplifier blocks and the selection and control of the operation of the memory mats such as the control of a data line sharing switch circuit (see FIG. 6) between the memory mats which share the sense amplifier blocks are effected by mat controllers MCNT01, MCNT23, MCNT45, MCNT67 provided between the pairs of memory mats.

The mat controllers MCNT01, MCNT23, MCNT45, MCNT67 are supplied with a mat selection signal MS and sense amplifier control signals ØSAN, ØSAN2, ØSAP1B. The mat selection signal MS is a 3-bit signal for designating which one of the eight memory mats MMAT0–MMAT7 is selected and actually corresponds to 3 high-order bits of the row address signal held by a row address buffer RAB. The mat controllers MCNT01, MCNT23, MCNT45, MCNT67 decode the mat selection signal MS and control the operation of the sense amplifier blocks and the activation of the row address decoders in such a way as to operate the memory mat designated by the mat selection signal MS. When the mat selection signal MS designates the memory mat MMAT0, for example, the row address decoder XD0 is activated and the sense amplifier block SA01 is connected via the data sharing switch circuit to the memory mat MMAT0, whereby the operation of selecting a memory cell in the memory mat MMAT0 is made possible. A detailed description will be given of the sense amplifier control signals ØSAN, ØSAN2, ØSAP1B later.

Each of the column switch circuit blocks CSWn receives a column selection signal from a column address decoder YD and thereby selects four sets of complementary data lines from the corresponding memory mat, thus causing complementary common data lines CD0–CD3 to conduct. The column address decoder YD is activated by means of a timing signal ØY which is set to an enable level after the operation of selecting a word line is defined during the reading operation, whereby an internal complementary column address signal AY is decoded and the column selection signal is generated.

The operation of word line selection and column selection connects the four memory cells designated by the mat selection signal MS, the internal complementary row address signal AX and the internal complementary column address signal AY to the complementary common data lines DC0–CD3. The memory array 1 is also similarly constituted though its constitution is not particularly illustrated for purposes of drawing simplification, and complementary common data lines CD4–CD7 are also disposed on the memory array MARY1 side.

The aforesaid complementary common data lines CD0–CD7 are coupled, though not limited, to a data input-output circuit DI0. The data input-output circuit DI0 includes a main amplifier, a write amplifier and a data input-output buffer. This data input-output circuit DI0 performs data input operations for writing when a timing signal ØW is set to an enable level and a data output operations for reading when a timing signal ØR is set to the enable level. A dynamic RAM of this embodiment writes and read data of 8 bits, wherein the memory array MARY0 is for 4 low-order bits, whereas the memory array MARY1 is for 4 high-order bits. Of course, this is for purposes of example only, and other bit groupings could be utilized if desired.

The row address buffer RAB takes in and holds row address signals supplied from external address input terminals A0–Ai via an address multiplexer AMX. This operation of taking in the signals is ordered by a high-level timing signal ØXL supplied from a timing generating circuit TG.

The address multiplexer AMX transmits, though not limited, the row address signal supplied via the external terminals A0–Ai when supplied with a disable-level timing signal ØREF from the timing generating circuit TG while the dynamic RAM is in the normal operating mode. When the timing signal ØREF is set to the enable level while the dynamic RAM is in a CBR (CAS before RAD) refresh cycle, moreover, a refresh address signal supplied from a refresh address counter RFC is selected and transmitted to the row address buffer RAB.

The refresh address counter RFC performs, though not limited, counting operations and forms a refresh address in synchronization with a timing signal ØRC supplied from the timing generating circuit TG every predetermined cycle while the dynamic RAM is in the CBR refresh mode.

The column address buffer CAB takes in the column address signal supplied via the external address input terminals A0–Ai in synchronization with the timing at which a control signal ØYL supplied from the timing generating circuit TG is enabled and holds the signal.

The timing generating circuit TG is supplied with a row address strobe signal RAS* (the mark * means that the signal marked therewith is a low-enable signal), a column address strobe CAS*, a write enable signal WE* and an output enable signal OK*. Further, the timing generating circuit TG also judges the operating mode of the dynamic RAM on the basis of their levels and variation timing, forms various timing signals and controls the inner operation of the dynamic RAM. The row address strobe signal RAS* of low level designates chip selection and notifies that the row address signal is effective. Therefore, the timing controller TG takes in the row address signal and sequentially forms the control signal for effecting the operation of selecting the word line and the memory mat. The column address strobe CAS* notifies that the column address signal is effective. When the signal is set to the enable level, the timing controller TG takes in the column address signal and sequentially forms the control signal for effecting the operation of selecting the column. The write enable signal WE* of enable level instructs the DRAM to perform the write operation, whereas the output enable signal OE* of low level instructs the DRAM to perform the read operation. The CBR refresh mode is designated when the column address strobe CAS* is set to the enable level before the row address strobe signal RAS* is enabled.

Figure 6:
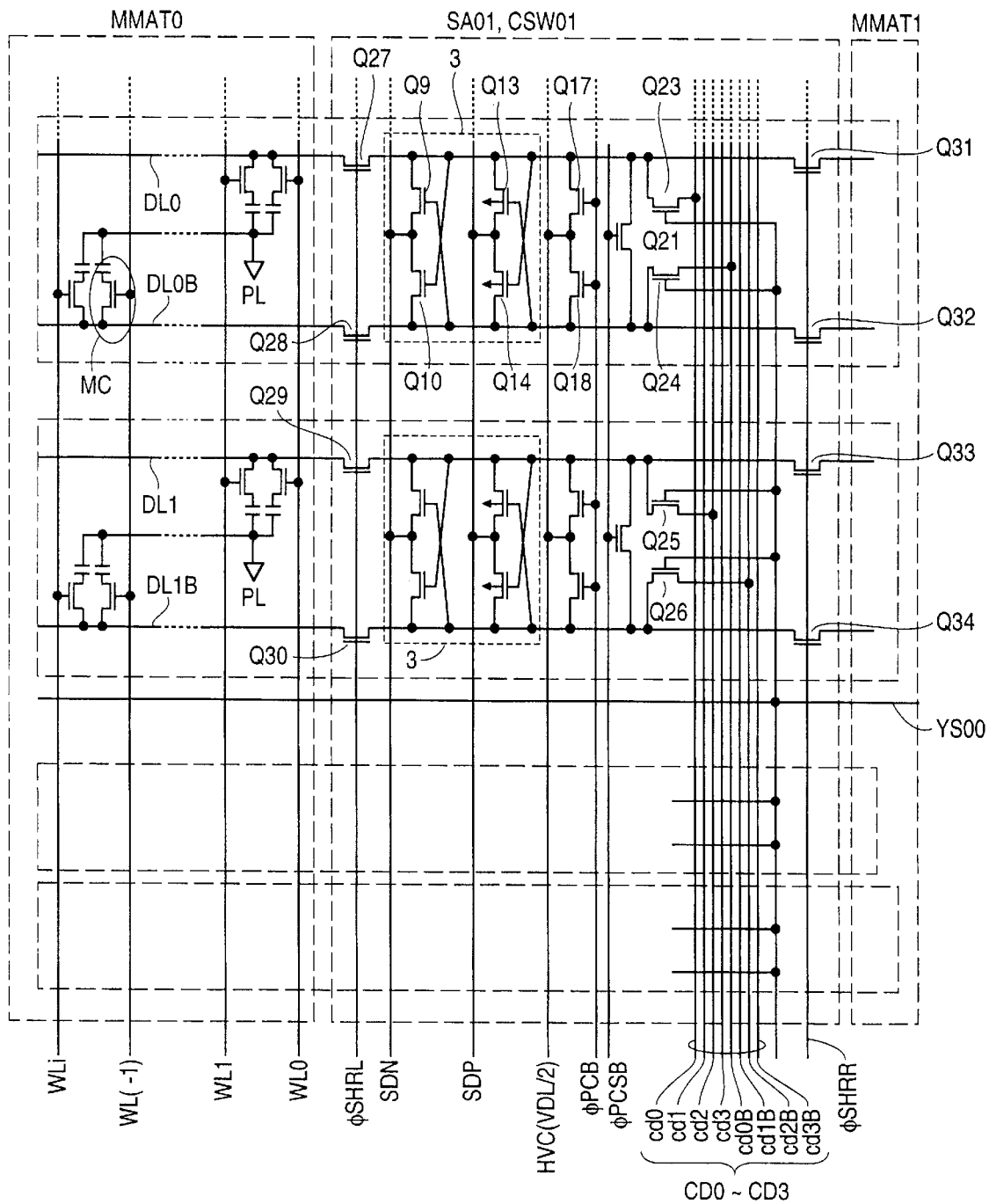
FIG. 6 is a partial circuit diagram including memory mats, a sense amplifier block and a column switch circuit block.

FIG. 6 is a partial circuit diagram including the memory mats MMAT0, MMAT1, the sense amplifier block SA0I and the column switch circuit block CSW01. FIG. 6 particularly shows a representative circuit portion receiving one column selection signal YS00. In FIG. 6, MOS transistors each marked with arrows at the channel (back gate) portion are of a P-channel type and distinguished from N-channel MOS transistors which are shown without arrows.

In FIG. 6, WL0–WLi represent word lines representatively shown therein; DL0, DL0B, DL1, DL1B, complementary data lines; and MC, a dynamic memory cell. The dynamic memory cell MC is a series circuit connected to plate potential PL (VDL/2), the series circuit including a selective MOS transistor Q1 and a storage capacitor SC. Q27–Q34 are sharing switch MOS transistors constituting a data line sharing switch circuit. The sharing switch MOS transistors Q27–Q30, disposed between the sense amplifier block SA01 and the memory mat MMAT0 and representatively shown in FIG. 6, are controlled by a control signal ØSHRL in terms of their switching. On the other hand, the sharing switch MOS transistors Q31–Q34, arranged between the column switch circuit block CSW01 and the memory mat MMAT1 and representatively shown therein, are controlled by a control signal ØSHRR in terms of their switching. When the mat selection signal MS selects the memory mat MMAT0, for example, the mat controller MCNT01 controls the control signal ØSHRL so as to set this signal at a high level. When the mat selection signal MS selects the memory mat MMAT1, the mat controller MCNT01 controls the control signal ØSHRR so as to set this signal at a high level. The sharing switch MOS transistors in connection with the memory mat not selected by the mat selection signal MS are controlled by a corresponding mat controller so as to turn off the transistors.

Reference numeral 3 denotes a sense amplifier of a differential amplifier circuit in a static latch form having N-channel MOS transistors Q9, Q10 and P-channel MOS transistors Q13, Q14, with a sense amplifier 3 being provided for every complementary data line. In this case, an operating supply voltage is supplied via drive lines SDN, SDP to the sense amplifier 3. The drive lines SDN, SDP are commonly used for the sense amplifier 3. The control of supplying the operating voltage to the drive lines SDN, SDP will be described later. Each complementary data line is provided with, other than the sense amplifier 3, a MOS transistor Q21 for equalizing the complementary data line while the dynamic RAM is on standby. The switching of the MOS transistor Q21 is controlled by a control signal ØPCSB. Further, MOS transistors Q17, Q18 for equalizing the complementary data line and simultaneously supplying precharge voltage thereto are also provided. The precharge potential is at half the level of the step-down voltage VDL and supplied via wiring HVC. The switching of the MOS transistors Q17, Q18, are controlled by a control signal ØPCB. The control signals ØPCB, ØPCSB are output from the timing controller TG. The precharge voltage VDL/2 is generated by a precharge voltage producing circuit 4 comprising, e.g., a resistance divider circuit for receiving the step-down voltage VDL.

In FIG. 6, Q23, Q24 represent column switches provided between the complementary data lines DL0, DL0B and the complementary common data lines CD0 (cd0, cd0B; and Q25, Q26, column switches provided between the complementary data lines DL1, DL1B and the complementary common data lines CD1 (cd1, cd1B). Similar column switches are also provided for the respective complementary data lines, and in sets of four pairs of complementary data lines. These complementary data lines are commonly connected to four pairs of complementary common data lines CD0 (cd0, cd0B), CD1 (cd1, cd1B), CD2 (cd2, cd2B) and CD3 (cd3, cd3B).

A description will subsequently be given of a circuit configuration for supplying operating voltage to the drive lines SDN, SDP of the sense amplifier 3.

As stated above, the DRAM of this embodiment receives the external supply voltage VDD of, for example, 3.3 V from the external power terminal. The MOS transistors in the memory arrays MARY0, MARY1 are small-sized so as to increase the storage capacity, whereby the thickness of the gate oxide film is reduced as the gate length of the MOS transistor is decreased. Therefore, the operating voltage of the memory arrays MARY0, MARY1 is lowered and the step-down voltage VDL of, for example, 2.2 V is employed as the basic operating voltage. The operating speed of the sense amplifier 3 is lowered if only the step-down voltage VDL is supplied to the drive line SDP. Therefore, a sense-amplifier overdriving technique is employed so that the external supply voltage VDD is given to the drive line SDP at the initial stage of sense-amplifier activating timing and, subsequently, the step-down voltage VDL is given thereto to operate the sense amplifier.

Figure 1:
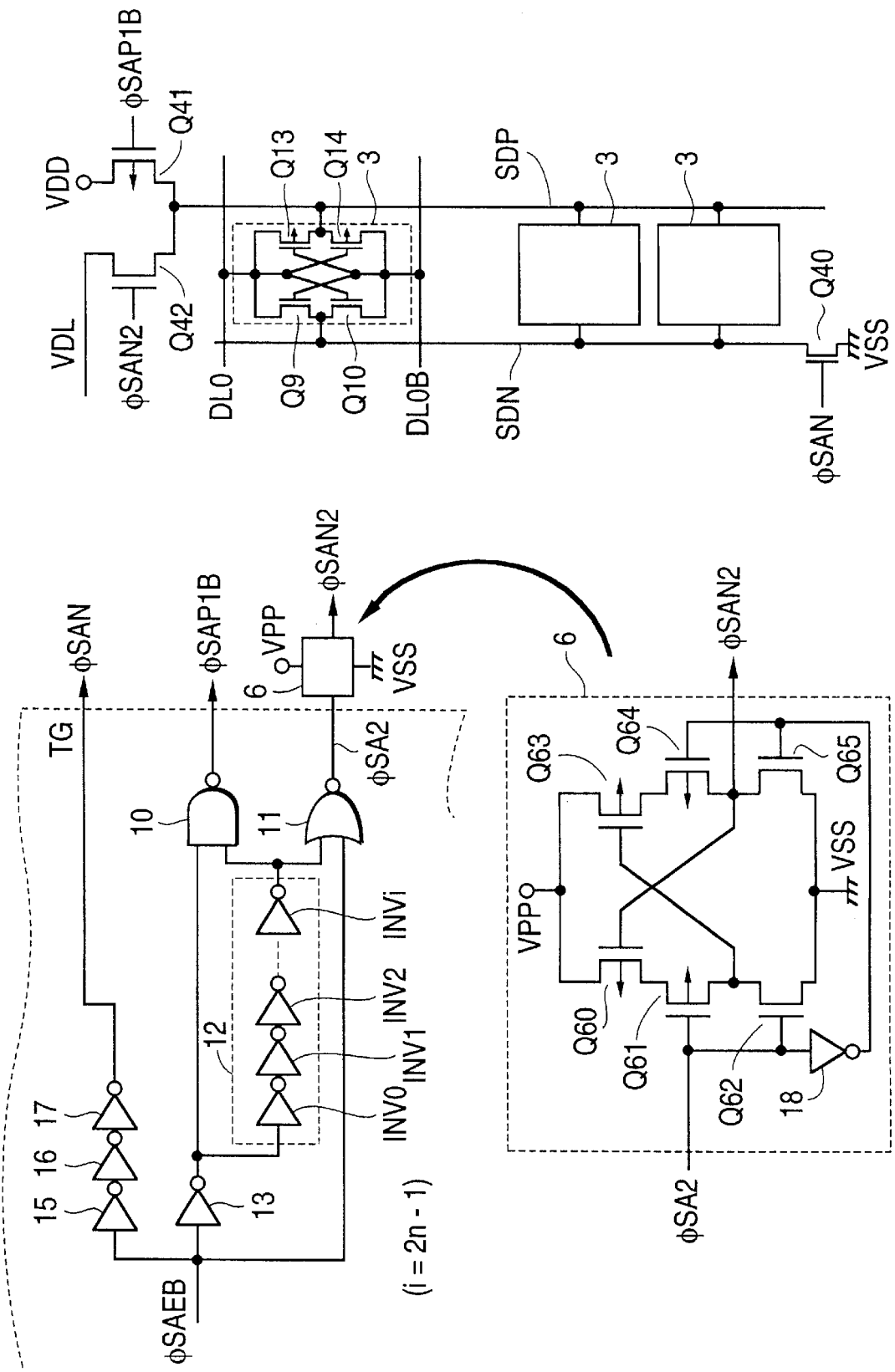
FIG. 1 is a circuit diagram showing a circuit for supplying operating voltage to the drive line SDN, SDP of a sense amplifier of an embodiment of the present invention.

FIG. 1 shows a circuit for supplying operating voltage to the drive lines SDN, SDP of the sense amplifier 3. The drive line SDN is coupled to the common drain of the N-channel MOS transistors Q9, Q10, and the drive line SDP to the P-channel MOS transistors Q13, Q14. Although one row of sense amplifiers 3 is representatively shown in FIG. 1, the drive lines SDN, SDP shown in this case generally represent those for all the sense amplifiers 3 provided in the DRAM of this embodiment. The ground potential VSS is connected to the drive line SDN via an N-channel MOS transistor Q40 controlled by a control signal ØSAN in terms of its switching. The external supply voltage VDD is supplied to the drive line SDP via a P-channel MOS transistor Q41 controlled by a control signal ØSAP1B in terms of its switching, and the step-down voltage VDL is also supplied thereto via an N-channel MOS transistor Q42 controlled by a control signal ØSAN2 in terms of its switching. The control signals ØSAN, ØSAP1B, ØSAN2 are output from the timing controller TG.

A circuit for forming the control signals ØSAN, ØSAP1B, ØSAN2 is shown as part of the timing controller TG of FIG. 1. More specifically, a two-input NAND gate 10 and a two-input NOR gate 11 are provided so that the control signal ØSAP1B is first activated and the control signal ØSAN 2 is then activated during the low-level period of a control signal ØSAEB (as the internal control signal of the timing controller TG which is not shown in FIG. 1) for defining the activation period of the sense amplifier 3. One of the input terminals of the NAND gate 10 and one of the input terminals of the NOR gate 11 are mutually coupled and a delay circuit 12 with an odd number of CMOS inverters INV0–INVi (i=2n−1) connected in series is placed between one and the other input terminals of the NAND gate 10. The control signal ØSAEB is supplied via a CMOS inverter 13 to the other input terminal of the NAND gate 10, and the control signal ØSAEB is supplied to the other input terminal of the NOR gate 11. The control signal ØSAP1B is output from the NAND gate 10, and the control signal ØSAN is generated by passing the control signal ØSAEB through series-connected three-stage CMOS inverters 15, 16, 17. The output ØSA2 of the NOR gate 11 is supplied to a level conversion circuit 6 so as to make the output of the level conversion circuit 6 the control signal ØSAN2.

The level conversion circuit 6 is a circuit for enlarging the amplitude of an input signal and transmitting the input signal to the output. In the level conversion circuit 6, a series circuit comprising P-channel MOS transistors Q60, Q61 and an N-channel MOS transistor Q62 and a series circuit comprising P-channel MOS transistors Q63, Q64 and an N-channel MOS transistor Q65 are arranged in parallel between the step-up voltage VPP and the ground potential VSS. The input signal ØSA2 is supplied to the gates of the MOS transistors Q61, Q62, whereas the input signal ØSA2 is inverted by a CMOS inverter 18 before supplied to the gates of the MOS transistors Q64, Q65. The connection node of the MOS transistors Q61, Q62 is coupled to the gate of the MOS transistor Q63, and the connection node of the MOS transistors Q64, Q65 is coupled to the gate of the MOS transistor Q60. The amplitude of the input signal ØSA2 is equal to the potential difference between the ground potential VSS and the supply voltage VDD. In other words, the operating supply voltage of the NOR gate 11 corresponds to VDD, VSS. While the control signal ØSA2 is kept at the level of the supply voltage VDD, the control signal ØSA2 is set at the level of the step-up voltage VPP due to the ON state of the MOS transistor Q62, the OFF state of the MOS transistor Q65 and the ON state of the MOS transistors Q63, Q64. When the control signal ØSA2 is set at the level of the ground potential VSS, the control signal ØSA2 is set at the level of the ground potential VSS because of the OFF state of the MOS transistor Q62, the OFF state of the MOS transistor Q65, the ON state of the MOS transistors Q60, Q61 and the OFF state of the MOS transistor Q63. Therefore, the input signal ØSA2 whose amplitude is equal to the potential difference between the ground potential VSS and the supply voltage VDD is converted to the output signal ØSAN2 whose amplitude is equal to the potential difference between the ground potential VSS and the step-up voltage VPP, so that the logical values of both the signals ØSA2, ØSAN2 conform to each other. The step-up voltage VPP is, for example, 4.0 V.

With regard to the level of ØSAN2 applied to the gate of Q42, it is noted that this should be at least higher than the level of VDL and preferably greater than or equal to VDL plus the threshold voltage VTH for the transistor Q42. This serves to ensure that the source voltage of Q42 will at least maintain a level equal to VDL.

Figure 2:
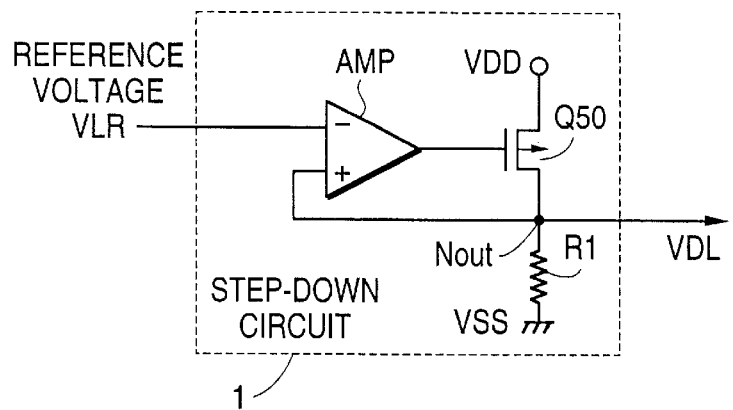
FIG. 2 is a circuit diagram showing an exemplary step-down circuit used in the present invention.

The step-down circuit 1 of FIG. 5 for generating VDL has, as shown in FIG. 2, an output terminal Nout as the series connection node of a P-channel MOS transistor Q50 connected to the external supply voltage VDD and a high resistance resistor R1 coupled to the ground potential VSS, and an operational amplifier AMP1 for controlling the MOS transistor Q50 in terms of its switching by feeding back the voltage from output terminal Nout to the non-inverted input terminal (+) and by supplying a reference voltage VLR to the inverted input terminal (−). The operational amplifier AMP operates to increase the conductance of the MOS transistor Q50 (decrease the ON resistance) when the potential of the output terminal Nout is set lower than the reference voltage VLR and operates to decrease the conductance of the MOS transistors Q50 (increase the ON resistance) when the potential of the output terminal Nout is set higher than the reference voltage VLR so as to maintain the voltage at the output terminal Nout at the reference voltage VLR by effecting feedback control. Thus, the voltage generated at the output terminal Nout is made the step-down voltage VDL. In particular, the resistor R1 has an extremely high resistance value to minimize a lead-through current flowing through the series circuit composed of the MOS transistor Q50 and the resistor R1. In the feedback control, the current flowing through the output terminal Nout via the high resistance resistor R1 is so low as to be substantially negligible. Incidentally, the reference voltage VLP is a control voltage of, for example, 2.2 V generated by any known reference voltage generating circuit (not shown).

Figure 3:
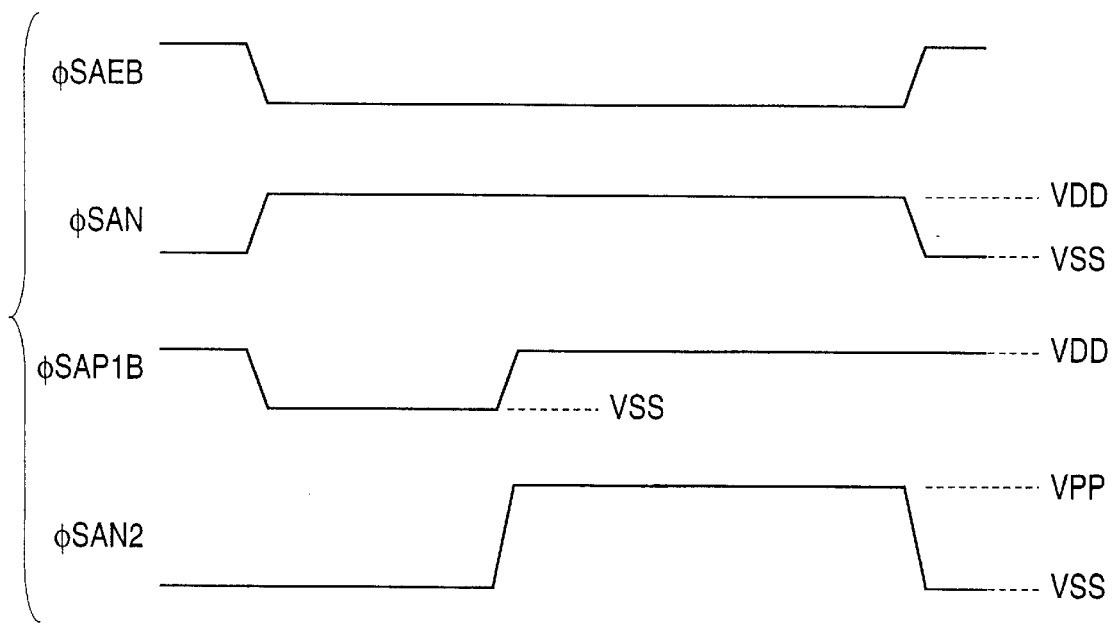
FIG. 3 is a waveform chart showing the waveforms of control signals ØSAN, ØSAP1B, ØSAN2 for use when the operating voltage is supplied to the drive lines SDN, SDP by means of the circuit arrangement of FIG. 1.

FIG. 3 is a waveform chart showing the waveforms of control signals ØSAN, ØSAP1B, ØSAN2 for use when the operating voltage is supplied to the drive lines SDN, SDP by means of the circuit arrangement of FIG. 1.

When the level of the control signal ØSAEB for defining the activation period of the sense amplifier 3 is changed to a low active level, the level of the control signal ØSAP1B is lowered (to the level of ground potential VSS) and the supply voltage VDD is supplied via the MOS transistor Q41 to the drive line SDP, whereby a minute potential difference appearing in the complementary data lines DL0, DL0B is quickly amplified through the selection of the memory cell since the current supplied to the P-channel MOS transistors Q13, Q14 of the sense amplifier 3 is relatively large. Subsequently, the level of the control signal ØSAP1B is changed to a high level (the level of the supply voltage VDD) and the control signal ØSAN2 is also made to have a high level (the level, of the step-up voltage VPP), so that the step-down voltage VDL is supplied via the MOS transistor Q42, to the drive line SDP. The level of the control signal ØSAN is changed to the high level in synchronization with the low-level period of the control signal ØSAEB. Thus, the levels reached by the complementary data lines driven by the sense amplifier 3 are regulated so that one of the levels is the ground potential VSS, and the other the step-down voltage VDL.

In the embodiment described so far, the MOS transistor Q42 is of the N-channel type, and the high level of the control signal ØSAN2 for causing the MOS transistor Q42 to conduct is equal to that of the word-line step-up voltage VPP. Therefore, the gate-to-source voltage of the MOS transistor Q42 is relatively high. Moreover, the carrier mobility of the N-channel MOS transistors is three times as large as that of the P-channel MOS transistors. In comparison with a case where the P-channel MOS transistor Q42 is used and controlled so as to be made to conduct by means of the ground potential VSS, the MOS transistor Q42 can supply a relatively large current. Consequently, the sense amplifier 3 can be operated at high speed even in a situation where the operating voltage becomes lower.

Assuming VSS=0 V, VDD=3.3 V, VDL=2.2 V and VPE=4.0 V, for example, the gate-to-source voltage of the N-channel MOS transistor Q42 is 1.8 V when the MOS transistor Q42 is turned on by the gate voltage of VPE=4.0 V. The gate-to-source voltage of the MOS transistor Q42 becomes 2.2 V when turned on by the same gate voltage if a P-channel MOS transistor Q42 is used instead. Although the gate-to-source voltage of the P-channel MOS transistor is apparently higher, it is still generally preferable to use an N-channel MOS transistor as the transistor Q42 to enhance the capability of supplying a relatively larger current when the carrier mobility is taken into consideration. Particularly, when the transistor Q42 is a P-channel MOS transistor Q42 and is turned on by the ground potential VSS, the gate-to-source voltage (VGS)=step-down voltage VDL and VGS tends to decrease as the operating voltage of the sense amplifier 3 is lowered. In the case of an arrangement in which the N-channel MOS transistor Q42 is turned on by the step-up voltage VPP of this embodiment, the gate-to-source voltage for turning on the N-channel MOS transistor Q42 can be determined in accordance with factors such as the withstanding voltage of the gate oxide film of the MOS transistor Q42, and VGS does not have a tendency to decrease as the operating voltage is lowered. Therefore, the arrangement in which the transistor Q42 is a N-channel MOS transistor Q42 and turned on by the step-up voltage is superior in dealing with high speed sense amplifiers in a situation where the operating voltage will be further lowered during operation of the device. Moreover, the circuit scale is prevented from being increased as much as possible when the operating speed of the sense amplifier 3 is increased by generating the control signal ØSAN2 for controlling the switching of the N-channel MOS transistor Q42 by utilizing the output VPP of the step-up circuit 2 for forming the word-line selection level.

Figure 4:
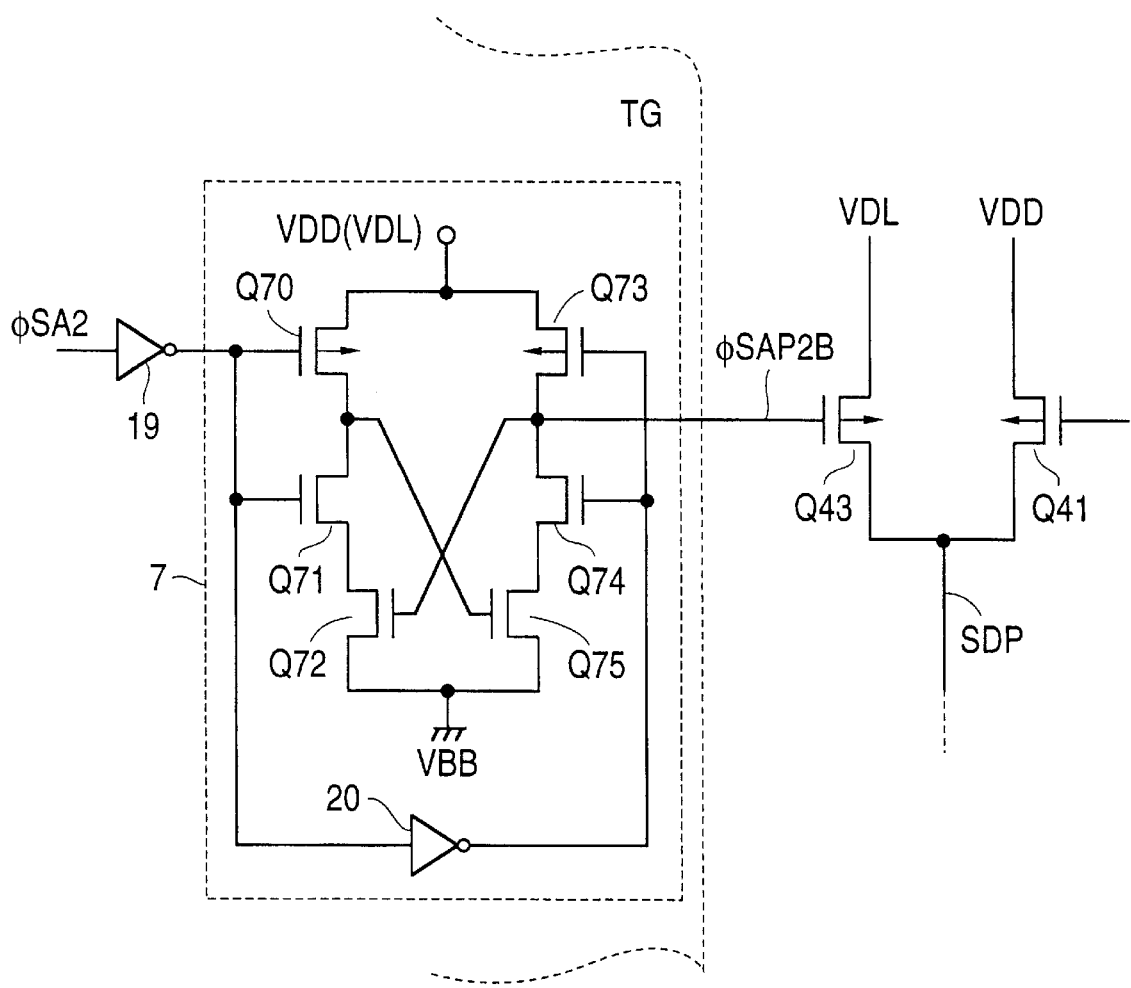
FIG. 4 is an arrangement for supplying step-down voltage VDL to the drive line SDP of the sense amplifier in accordance with another embodiment of the present invention.

FIG. 4 shows another embodiment of an arrangement of supplying the step-down voltage VDL to the drive line SDP of the sense amplifier 3. In this embodiment, a P-channel MOS transistor Q43 is used in place of the N-channel MOS transistor Q42 of FIG. 1, whereby the gate-to-source voltage of the MOS transistor Q43 is made relatively higher by setting the amplitude of a switching control signal within the range of the substrate bias voltage VBE to the supply voltage VDD. In FIG. 4, a switching control for controlling the switching of the MOS transistor Q43 is the signal ØSAP2B, and the amplitude of the signal is equal to the potential difference between the supply voltage VDD and the substrate bias voltage VBB.

In FIG. 4, reference numeral 7 denotes a level conversion circuit. The level conversion circuit 7 is a circuit for receiving the control signal ØSA2 inverted by a CMOS inverter 19 and enlarging the amplitude of the input signal to transmit the resulting signal to the output. In the level conversion circuit 7, a series circuit of a P-channel MOS transistor Q70 and N-channel MOS transistors Q71, Q72 and a series circuit of a P-channel MOS transistor Q73 and N-channel MOS transistors Q74, Q75 are arranged in parallel between the supply voltage VDD and the substrate bias voltage VBB. An inverted input signal ØSA2 is supplied to the gates of the MOS transistors Q70, Q71, whereas the input signal ØSA2 is supplied via CMOS inverters 19, 20 to the gates of the MOS transistors Q73, Q74. The node between the MOS transistors Q70, Q71 is coupled to the gate of the MOS transistor Q75, and the node between the MOS transistors Q73, Q74 is coupled to the gate of the MOS transistor Q72. The amplitude of the input signal ØSA2 is equal to the potential difference between the ground potential VSS and the supply voltage VDD (the operating voltages of the inverters 19, 20 are VSS, VDD. While the control signal ØSA2 is kept at the level of the supply voltage VDD, the control signal ØSAP2B is set at the level of the substrate bias voltage VBB under the conditions of the ON state of the MOS transistor Q70, the OFF state of the MOS transistor Q73 and the ON state of the MOS transistor Q74, Q75. When the control signal ØSA2 is set at the level of the ground potential VSS, the control signal ØSAP22 is set at the level of the supply voltage VDD under the conditions of the OFF state of the MOS transistor Q70, the OFF state of the MOS transistor Q71, the ON state of the MOS transistors Q73, Q72 and the OFF state of the MOS transistor Q75. Therefore, the logical value of the input signal ØSA2 whose amplitude is equal to the potential difference between the ground potential VSS and the supply voltage VDD is inverted, and the input signal ØSA2 is converted to the output signal ØSAP2B whose amplitude is equal to the potential difference between the substrate bias voltage VBB and the supply voltage VDD.

With the arrangement of FIG. 4, even though the P-channel MOS transistor Q43 is employed for supplying the step-down voltage VDL to the drive line SDP, the gate-to-source voltage of the MOS transistor Q43 can be made relatively high by setting the switching control signal amplitude within the range of the substrate bias voltage VBB to the supply voltage VDD. Consequently, the sense amplifier 3 can be operated at high speed even in a situation where the operating voltage becomes lower. However, the gate-to-source voltage of the MOS transistor Q43 still tends to decrease as the step-down voltage VDL becomes lower in the situation that the operating voltage becomes lower, and this factor must be considered before using this embodiment. The circuit scale for this embodiment is prevented from being increased as much as possible when the operating speed of the sense amplifier 3 is increased by utilizing the negative voltage generated formed by the substrate bias voltage VBB.

A description has been given of the specific embodiments of the present invention made by the present inventors. However, the present invention is not limited to these embodiments but may be modified in various manners without departing the scope and spirit thereof. For example, although an example has been described where the sense amplifier is overdriven in the aforesaid embodiment, MOS transistors similar to Q42, Q43 may be arranged for supplying the operating voltage to the drive lines on the high-potential side of the sense amplifier even in a case where no overdriving is used. When such overdriving is employed, moreover, the arrangement of Q42, Q43 may also be applied to the MOS transistor Q41 used to provide the high level voltage VDD to the drive line SDP. Further, the memory mat configuration, the logical structure of mat selection, the number of parallel input-output data bits and so forth are not limited to those of the embodiments and can be adequately altered. Further, the logical constitution of circuits in which the control signals ØSAN, ØSAP1B, ØSAN2 for controlling the sense amplifier are generated is not limited to what has been shown in FIG. 1 but may be modified appropriately.

Although a description has been given of a case where the present invention is applied to a DRAM, that is, to the field of the background of the present invention made by the present inventors, the application of the invention is not limited to such a field but may be applied to those including semiconductor integrated circuits having differential amplifier circuits for receivers for data transmission such as synchronous DRAMs operating in synchronization with clock signals, pseudo-static RAMs, on-chip memories of data processing LSIs for microcomputers and the like.

As is clear from the foregoing description, the present invention provides a number of advantages. For example, in accordance with the preferred embodiment of the present invention, the MOS transistor Q42 for supplying the operating voltage or the step-down voltage to the drive line on the high-potential side of the differential amplifier is of N-channel type and the amplitude of a switching control signal is a voltage obtained by stepping up the supply voltage. Consequently, the gate-to-source voltage of the MOS transistor for supplying the operating voltage to the drive line on the high potential side is prevented from being lowered as the operating voltage becomes lowered, so that the differential amplifier circuit can be operated at high speed even in the state that the operating voltage is lowered.

Even in the case where the P-channel MOS transistor Q43 is used to supply the operating voltage to the drive line on the high-potential side of the differential amplifier circuit, the gate-to-source voltage of the MOS transistor can relatively be increased by setting the amplitude of the switching control signal within the range from the negative voltage to the supply voltage, which results in operating the differential amplifier circuit at high speed in a situation that the operating voltage is rendered lower.

The output of the step-up circuit for forming the word-line selection level is utilized as the step-up voltage for regulating the amplitude of the signal for controlling the switching of the N-channel MOS transistor Q42 for supplying the operating voltage to the drive line on the high potential side. Moreover, in the alternative embodiment the negative voltage generated by the substrate bias voltage generating circuit is also utilized as the negative voltage for regulating the amplitude of the signal for controlling the switching of the P-channel MOS transistor Q43 for supplying the operating voltage to the drive line. Thus, the circuit scale is prevented from being increased as much as possible when the operating speed of the differential amplifier circuit is increased.

We claim:

1. A semiconductor integrated circuit comprising:
a differential amplifier circuit which has a power input terminal and a pair of signal input terminals, and which amplifies the potential difference between complementary signal lines connected to said pair of signal input terminals,
a first switching MOS transistor which supplies a first driving voltage to said power input terminal,
a second switching MOS transistor which supplies to said power input terminal a second driving voltage whose level is lower than that of the first driving voltage, and
a control circuit which generates switching control signals for the first and second switching MOS transistors to overdrive the differential amplifier circuit by first causing the first driving voltage to be supplied to said power input terminal via the first switching MOS transistor and then causing the second driving voltage to be supplied to said power input terminal via the second switching MOS transistor for a period during which the differential amplifier circuit is activated,
wherein the first switching MOS transistor is of P-channel type and a high-level of its switching control signal has the potential of the first driving voltage, and wherein the second switching MOS transistor is of N-channel type and a high-level of its switching control signal has a higher potential than said first driving voltage to prevent lowering of the capability of the second switching MOS transistor to supply current to said power input terminal when said second driving voltage is supplied to said power input terminal via said second switching MOS transistor.

2. A semiconductor integrated circuit comprising:

a step-down circuit which generates a step-down voltage by stepping down a supply voltage supplied from the outside, a plurality of memory cells with their selection terminals connected to word lines, complementary signal lines connected to the data input-output terminals of the memory cells, a differential amplifier circuit which has a power input terminal and pair of signal input terminals, and which amplifies the potential difference between the complementary signal lines connected to said pair of signal input terminals, a first switching MOS transistor which supplies said supply voltage to said power input terminal, a second switching MOS transistor which supplies said step-down voltage to said power input terminal, and a control circuit which generates switching control signals for the first and second switching MOS transistors to overdrive the differential amplifier circuit by causing said supply voltage to be supplied to the drive line via the first switching MOS transistor and then causing said step-down voltage to be supplied to the drive line via the second switching MOS transistor for a period during which the differential amplifier circuit is activated;

wherein the first switching MOS transistor is of P-channel type, and a high-level of its switching control signal has the potential of said supply voltage; and the second switching MOS transistor is of N-channel type and a high-level of its switching control signal has a higher potential than said supply voltage to prevent lowering of the capability of the second switching MOS transistor to supply current to said power input terminal when said step-down voltage is supplied to said power input terminal via said second switching MOS transistor.

3. A semiconductor integrated circuit as claimed in claim 2, further comprising a step-up circuit which provides a step-up voltage having a word-line selection level, wherein the step-up voltage which is output from the step-up circuit is generated by stepping up the supply voltage.

4. A semiconductor integrated circuit comprising:

a step-down circuit which generates a step-down voltage by stepping down a supply voltage supplied from the outside, a plurality of memory cells with their selection terminals connected to word lines, complementary signal lines connected to the data input-output terminals of the memory cells, a differential amplifier circuit which has a power input terminal and a pair of signal input terminals, and which amplifies the potential difference between complementary signal lines connected to said pair of signal input terminals, a first switching MOS transistor which supplies the supply voltage to said power input terminal, a second switching MOS transistor which supplies said step-down voltage to said power input terminal, a control circuit which generates a switching control signal to overdrive the differential amplifier circuit by first causing the supply voltage to be supplied to said power input terminal via the first switching MOS transistor and then causing the step-down voltage to be supplied to said power input terminal via the second switching MOS transistor for a period during which the differential amplifier circuit is activated, and a circuit which generates a negative voltage having negative polarity with respect to the supply voltage, wherein said first switching MOS transistor of P-channel type and a high level of its switching control signal is the potential of the supply voltage, and wherein said second switching MOS transistor is of P-channel types a high level of said second switching control signal has the potential of said supply voltage and a low level of said second switching control signal has the potential of said negative voltage to prevent lowering of the capability of the second switching MOS transistor to supply current to said power input terminal when said step-down voltage is supplied to said power input terminal via said second switching MOS transistor.

5. A semiconductor integrated circuit as claimed in claim 4, wherein said the negative voltage is used for a substrate bias voltage.

6. A semiconductor integrated circuit comprising:

a step-down circuit which generates a step-down voltage by stepping down a supply voltage supplied from the outside, a step-up circuit which generates a step-up voltage having a word-line selection level, a plurality of memory cells with their selection terminals connected to word lines, complementary signal lines connected to the data input-output terminals of the memory cells, a differential amplifier circuit which has a power input terminal and a pair of signal input terminals, and which amplifies the potential difference between complementary signal lines connected to said pair of signal input terminals, a switching MOS transistor which supplies said step-down voltage to said power input terminals, and a control circuit which generates a switching control signal for causing the step-down voltage to be supplied to said power input terminal via the switching MOS transistor for a period during which the differential amplifier circuit is activated, wherein said switching MOS transistor is of N-channel type and the switching control signal has a level corresponding to the potential of the word-line selection level formed in the step-up circuit to prevent lowering of the capability of the switching MOS transistor to supply current to said power input terminal when said step-down voltage is supplied to said power input terminal via said switching MOS transistor.

7. A semiconductor integrated circuit comprising:

a step-down circuit which generates a step-down voltage by stepping down a supply voltage supplied from the outside, a plurality of memory cells with their selection terminals connected to word lines, complementary signal lines connected to the data input-output terminals of the memory cells, a differential amplifier circuit which has a power input terminal and a pair of signal input terminals, and which amplifies the potential difference between complementary signal lines connected to said pair of signal input terminals, a switching MOS transistor which supplies the step-down voltage to said power input terminal, a control circuit which generates a switching control signal for causing the step-down voltage to be supplied to said power input terminal via the switching MOS transistor for a period during which the differential amplifier circuit is activated, and a circuit which generates a substrate bias voltage having negative polarity with respect to the supply voltage, wherein the switching MOS transistor is of P-channel type, wherein a high level of said switching control signal has a level corresponding to the potential of the supply voltage and wherein a low level of said switching control signal has the potential of said substrate bias voltage to prevent lowering of the capability of the switching MOS transistor to supply current to said power input terminal when said step-down voltage is supplied to said power input terminal via said switching MOS transistor.

8. A semiconductor memory comprising:

a pair of data lines;

a sense amplifier including a pair of P-channel MOSFETs and a pair of N-channel MOSFETs wherein each of pairs of P-channel and N-channel MOSFETs has sources coupled in common, drains coupled to said pair of data lines, respectively, and gates cross-coupled to said drains, respectively;

a first terminal for receiving a first voltage;

a second terminal for receiving a second voltage which is lower than said first voltage;

a first switch MOSFET coupled between said first terminal and said sources of said pair of P-channel MOSFETs;

a second switch MOSFET coupled between said second terminal and said sources of said pair of P-channel MOSFETs; and a control circuit outputting signals supplied to the gates of said first and second switch MOSFETs to overdrive the sense amplifier such that, in a first period, said first switch MOSFET is ON state and, in a second period after said first period, said first switch MOSFET is OFF state and said second switch MOSFET is ON state, wherein said second switch MOSFET is of N-channel type and wherein the gate voltage of said second switch MOSFET is higher than said second voltage during said second period to prevent lowering of the capability of the second switch MOSFET to supply current to the sources of the pair of P-channel MOSFETs when said second voltage is supplied to the sources of the pair of P-channel MOSFETs via said second switch MOSFET.

9. A semiconductor memory according to claim 8, wherein the gate voltage of the second switch MOSFET is at least equal to said second voltage plus the threshold voltage of the second switch MOSFET.

10. A semiconductor memory according to claim 8, wherein said control circuit comprises a delay circuit defining said first period, and wherein said first period has a predetermined dependence on said first voltage.

11. A semiconductor memory according to claim 10, wherein said delay circuit includes an inverter receiving said first voltage as a power source.

12. A semiconductor memory comprising:

a pair of data lines;

a plurality of word lines;

a plurality of dynamic memory cells each of which is coupled to one of said pair of data lines and one of said plurality of word lines;

a sense amplifier including a pair of P-channel MOSFETs and a pair of N-channel MOSFETs, wherein each of pairs of P-channel and N-channel MOSFETs has sources coupled in common, drains coupled to said pair of data line, respectively, and gates cross-coupled to said drains, respectively;

a first terminal receiving a first voltage;

a second terminal receiving a second voltage which is lower than said first voltage;

a step-down circuit receiving said first voltage and outputting said second voltage;

a first switch MOSFET coupled between said first terminal and said sources of said pair of P-channel MOSFETs;

a second switch MOSFET coupled between said second terminal and said sources of said pair of P-channel MOSFETs; and a control circuit outputting signals supplied to the gates of said first and second switch MOSFETs to overdrive said sense amplifier such that, in a first period, said first switch MOSFET is ON state and, in a second period after said first period, said first switch MOSFET is OFF state and said second switch MOSFET is ON state, a step-up circuit receiving said second voltage and outputting a control signal having a step-up voltage level higher than said second voltage;

wherein said second switch MOSFET is of N-channel type and wherein said control signal having said step-up voltage level is supplied to said gate of said second switch MOSFET during said second period to prevent lowering of the capability of the second switch MOSFET to supply current to the sources of the pair of P-channel MOSFETs when said second voltage is supplied to the sources of the pair of P-channel MOSFETs via said second switch MOSFET.

13. A semiconductor memory according to claim 12, wherein the step-up voltage has a high level equal to or greater than the second voltage plus a threshold voltage of the second switch MOSFET.

14. A semiconductor memory according to claim 12, wherein a drive signal having said step-up voltage level is supplied to a selected one of said word lines.

15. A semiconductor memory according to claim 14, wherein said control circuit comprises a delay circuit defining said first period, and wherein said first period has a predetermined dependence on said first voltage.

16. A semiconductor memory according to claim 11, wherein said delay circuit includes an inverter receiving said first voltage as a power source.

17. A semiconductor memory comprising:

a pair of data lines;

a sense amplifier including a pair of P-channel MOSFETs and a pair of N-channel MOSFETs, wherein each of pairs of P-channel and N-channel MOSFETs has sources coupled in common, drains coupled to said pair of data lines, respectively, and gates cross-coupled to said drains, respectively;

a terminal for receiving a high level voltage to be supplied to one of said data lines; and a switch MOSFET having a source coupled to said sources of said P-channel MOSFETs and a drain coupled to said terminal, wherein said switch MOSFET is of N-channel type and wherein the gate voltage of said switch MOSFET is higher than said high level voltage during ON state of said switch MOSFET to prevent lowering of the capability of the switch MOSFET to supply current to the sources of said P-channel MOSFETs during operation of the switch MOSFET.

18. A semiconductor memory according to claim 17, wherein the gate voltage of said switch MOSFET is at least equal to said high level voltage plus the threshold voltage of said switch MOSFET.

* * * * *